(12) United States Patent
Nie et al.

(10) Patent No.: US 10,551,705 B2
(45) Date of Patent: Feb. 4, 2020

(54) ARRAY SUBSTRATE, DISPLAY PANEL AND MOBILE TERMINAL

(71) Applicant: Wuhan China Star Optoelectronics Technology Co., Ltd., Wuhan, Hubei (CN)

(72) Inventors: Xiaohui Nie, Guangdong (CN); Zhihao Cao, Guangdong (CN); Qi Ding, Guangdong (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 28 days.

(21) Appl. No.: 16/110,197

(22) Filed: Aug. 23, 2018

(65) Prior Publication Data
US 2019/0265565 A1   Aug. 29, 2019

Related U.S. Application Data

(63) Continuation of application No. PCT/CN2018/082640, filed on Apr. 11, 2018.

(30) Foreign Application Priority Data

Feb. 28, 2018   (CN) .......................... 2018 1 0168022

(51) Int. Cl.
  *G06F 3/041*   (2006.01)
  *G02F 1/1362*   (2006.01)
  (Continued)

(52) U.S. Cl.
  CPC ...... *G02F 1/136286* (2013.01); *G02F 1/1368* (2013.01); *G02F 1/13338* (2013.01); *G02F 1/136209* (2013.01); *G02F 1/136227* (2013.01); *G06F 3/044* (2013.01); *G06F 3/0412* (2013.01); *G06F 3/0443* (2019.05);
  (Continued)

(58) Field of Classification Search
  CPC ........... G02F 1/136286; G02F 1/13338; G02F 1/136227; G02F 1/1368; G02F 2001/133357; G06F 3/0412; G06F 3/0443; H01L 27/1222; H01L 27/124; H01L 29/78633
  See application file for complete search history.

(56) References Cited

U.S. PATENT DOCUMENTS

2016/0294386 A1* 10/2016 Yang ...................... G06F 3/0416
2019/0155436 A1* 5/2019 Jin ......................... G06F 3/0412

* cited by examiner

*Primary Examiner* — Robert J Michaud
(74) *Attorney, Agent, or Firm* — Leong C. Lei

(57) ABSTRACT

The present invention relates to a display panel technology field. An array substrate comprises a first metal layer, a buffer layer, a semiconductor layer, an insulating layer, a scanning metal layer, an inter layer dielectric, and a second metal layer that are sequentially stacked on a glass substrate along a first direction, and a first pixel set and a second pixel set that are arranged alternately along a second direction; and a first conductive path sequentially connecting the first pixel set and a second conductive path sequentially connecting the second pixel set. The first conductive path and the second conductive path change lines alternately in the first metal layer and the second metal layer, such that the first pixel set and the second pixel set are sequentially connected in series. With the array substrate of the present invention, the metal layer for changing line can be eliminated.

16 Claims, 6 Drawing Sheets

(51) Int. Cl.
*H01L 27/12* (2006.01)
*H01L 29/786* (2006.01)
*G02F 1/1333* (2006.01)
*G02F 1/1368* (2006.01)
*G06F 3/044* (2006.01)
*G02F 1/136* (2006.01)

(52) U.S. Cl.
CPC ........ *H01L 27/124* (2013.01); *H01L 27/1222* (2013.01); *H01L 29/78633* (2013.01); *H01L 29/78675* (2013.01); *H01L 29/78696* (2013.01); *G02F 2001/13606* (2013.01); *G02F 2001/13685* (2013.01); *G02F 2001/133357* (2013.01); *G02F 2001/136231* (2013.01); *G06F 2203/04111* (2013.01)

ARRAY SUBSTRATE, DISPLAY PANEL AND MOBILE TERMINAL

RELATED APPLICATION

This application is a continuing application of PCT Patent Application No. PCT/CN2018/082640 entitled "ARRAY SUBSTRATE, DISPLAY PANEL AND MOBILE TERMINAL", filed on Apr. 11, 2018, which claims priority to Chinese Patent Application No. 201810168022.7, filed on Feb. 28, 2018, both of which are hereby incorporated in its entireties by reference.

FIELD OF THE INVENTION

The present invention relates to a display panel technology field, in particular to an array substrate, and a display panel and a mobile terminal comprising the array substrate.

BACKGROUND OF THE INVENTION

In the field of display, the resolution of the display panel is generally improved by increasing the pixel density per unit area. In such a structure, the pixel density increases, resulting in an overload of a drive circuit and a delay in signal transmission, and causing poor display and reducing product reliability. The current solution in the industry is to use two drive circuits at the top and bottom of the display panel to input signals at the same time, and add a metal layer on the basis of the original signal line metal layer, and realize that each drive circuit is designed to drive a part of the pixels by a double-layer metal changing line way, so as to avoid the signal delay caused by the overload of a single drive circuit. The disadvantage of this solution is that the production of the metal for changing line requires an additional mask manufacturing process, which increases the cost and process, and reduces the production capacity, and the metal layer added is used as a signal line for changing line and cannot be used as a touch electrode. As a result, the touch function can only be achieved by a metal layer stacked on the signal line for changing line (namely, On Cell Touch mode, also called Add on mode), resulting in an increase in the thickness and weight of the entire product, and the product positioning is limited to the middle-end or low-end market.

SUMMARY OF THE INVENTION

The present invention provides an array substrate applied to signal line routing of a high resolution display panel. With the array substrate of the present invention, the mask process of the metal for changing line can be eliminated, and the cost of the process can be reduced, and the In Cell Touch function can be realized at the same time, and product performance and quality added value can be improved. This invention comprises the following technical solutions.

An array substrate comprises a first metal layer, a buffer layer, a semiconductor layer, an insulating layer, a scanning metal layer, an inter layer dielectric, and a second metal layer that are sequentially stacked on a glass substrate along a first direction, and a signal hole connecting the semiconductor layer and the second metal layer, and a via hole connecting the first metal layer and the second metal layer; the array substrate further comprising a first pixel set and a second pixel set that are arranged alternately along a second direction, and a first conductive path sequentially connecting the first pixel set and a second conductive path sequentially connecting the second pixel set; in the first pixel set, the first metal layer serving as a path layer of the first conductive path and a signal layer of the second conductive path respectively; the second metal layer serving as a signal layer of the first conductive path and a path layer of the second conductive path respectively; in the second pixel set, the first metal layer serving as a signal layer of the first conductive path and a path layer of the second conductive path, respectively; the second metal layer serving as a path layer of the first conductive path and a signal layer of the second conductive path respectively.

The number of pixel units in the first pixel set is the same as the number of pixel units in the second pixel set.

The first metal layer and the second metal layer disclosed herein are provided with patterned lines that coordinate with each other, so that via hole of the first conductive path and the via hole of the second conductive path are separated from each other.

The array substrate further disclosed herein may comprise a source electrode and a drain electrode, and the semiconductor layer is provided with a channel for connecting the source electrode and the drain electrode of the array substrate, and the first metal layer covers the channel in the first direction to achieve light shielding of the channel.

The number of the channels of the semiconductor layer in a single pixel unit is two, and the two channels are arranged along a third direction perpendicular to the second direction; and the first metal layer is divided into a first metal block and a second metal block that are independent of each other, and the first metal block and the second metal block are used to shield the two channels from light respectively; and the first conductive path connects the first metal block, and the second conductive path connects the second metal block.

The first pixel set disclosed herein may comprise only one pixel unit, and the second pixel set disclosed herein may also comprise only one pixel unit, and each of the pixel units comprises the via hole of the first conductive path and the via hole of the second conductive path.

The first pixel set disclosed herein may comprise at least two pixel units, and the second pixel set disclosed herein may also comprise at least two pixel units, and the second metal layer in the first pixel set and in the second pixel set further comprises a signal line that sequentially connects the pixel units in the first pixel set or in the second pixel set, and a path line that sequentially connects the first metal layer.

The array substrate disclosed herein may further comprise a planarization layer and a third metal layer that are sequentially stacked along the first direction, and the planarization layer is positioned between the second metal layer and the third metal layer.

The present invention also relates to a display panel, the display panel comprises the above array substrate, and a first drive circuit and a second drive circuit which are respectively arranged at two ends of the array substrate along the second direction, and the first drive circuit being electrically connected to the first conductive path and the second drive circuit being electrically connected to the second conductive path.

The present invention relates to a mobile terminal, the mobile terminal comprises the above display panel.

In the array substrate of the present invention, the first metal layer, the buffer layer, the semiconductor layer, the insulating layer, and the second metal layer are sequentially stacked on the glass substrate along the first direction, so that the first metal layer, the semiconductor layer and the second metal layer are insulated from each other. Through the arrangement of the signal hole and the via hole, the first metal layer and the semiconductor layer are respectively connected with the second metal layer, thereby realizing the basis of changing line and signal conduction. By disposing the second pixel set and the first pixel set, the pixels in the array substrate are divided into two parts, which reduces the pressure of the drive circuit. The first pixel set and the second pixel set are sequentially connected through the line changing of the first conductive path and the second conductive path in the first pixel set and the second pixel set, thereby achieving the functions that the array substrate of the present invention is driven respectively. In the array substrate of the present invention, the original first metal layer is used as the wire for changing line function, which eliminates the need to separately set the third metal layer for changing line. Therefore, compared to the prior art, the array substrate of the present invention simplifies the structure, eliminates a mask manufacturing process, simplifies the process to reduce costs, and also realizes thinning of the substrate and improves product quality.

DETAILED DESCRIPTION OF PREFERRED EMBODIMENTS

Embodiments of the present invention are described in detail with the technical matters, structural features, achieved objects, and effects with reference to the accompanying drawings as follows. It is clear that the described embodiments are part of embodiments of the present invention, but not all embodiments. Based on the embodiments of the present invention, all other embodiments to those of ordinary skill in the premise of no creative efforts obtained should be considered within the scope of protection of the present invention.

Figure 1:
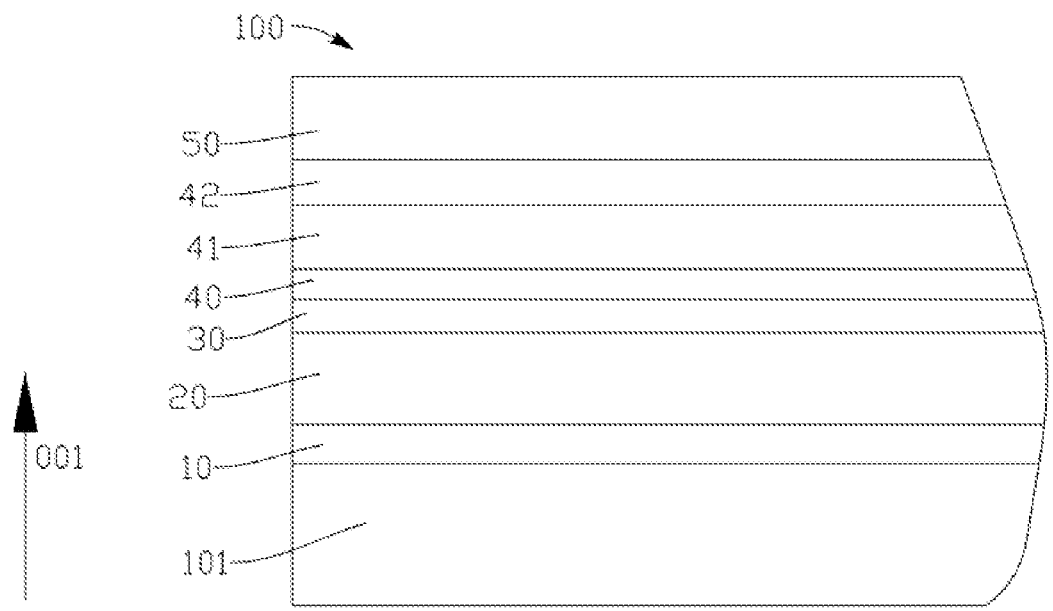
FIG. 1 is a schematic diagram of a layer structure of an array substrate according to some embodiments of the present invention.

In some embodiments, referring to FIG. 1, an array substrate comprises a first metal layer 10, a buffer layer 20, a semiconductor layer 30, an insulating layer 40, a scanning metal layer 41, an inter layer dielectric 42, and a second metal layer 50 that are sequentially stacked on a glass substrate 101 along a first direction 001. Sequentially, the material of the first metal layer 10 is molybdenum, and the material of the buffer layer 20 is silicon nitride and/or silicon oxide, and the semiconductor layer 30 is a layer of low temperature Poly-Si, and the material of the insulating layer 40 is also silicon nitride and/or silicon oxide, and the material of the scanning metal layer 41 is molybdenum, and the material of the inter layer dielectric 42 is silicon nitride and/or silicon oxide, and the material of the second metal layer 50 is titanium and/or aluminum. Therefore, the first metal layer 10, the scanning metal layer 41 and the second metal layer 50 are all conductive structure layers, the buffer layer 20, the inter layer dielectric 42 and the insulating layer 40 are all made of insulating materials, and the semiconductor layer 30 is made of a semiconductor material. The first metal layer 10, the semiconductor layer 30, the scanning metal layer 41, and the second metal layer 50 are separated by an insulator, and do not form a conductive path with each other. As can be seen from FIG. 2, the array substrate 100 is further provided with a signal hole 60 and a via hole 70. The signal hole 60 is used to connect the semiconductor layer 30 and the second metal layer 50, so as to realize the transmission of signal data to the pixel unit 200. The via hole 70 is used to connect the first metal layer 10 and the second metal layer 50.

Figure 3:
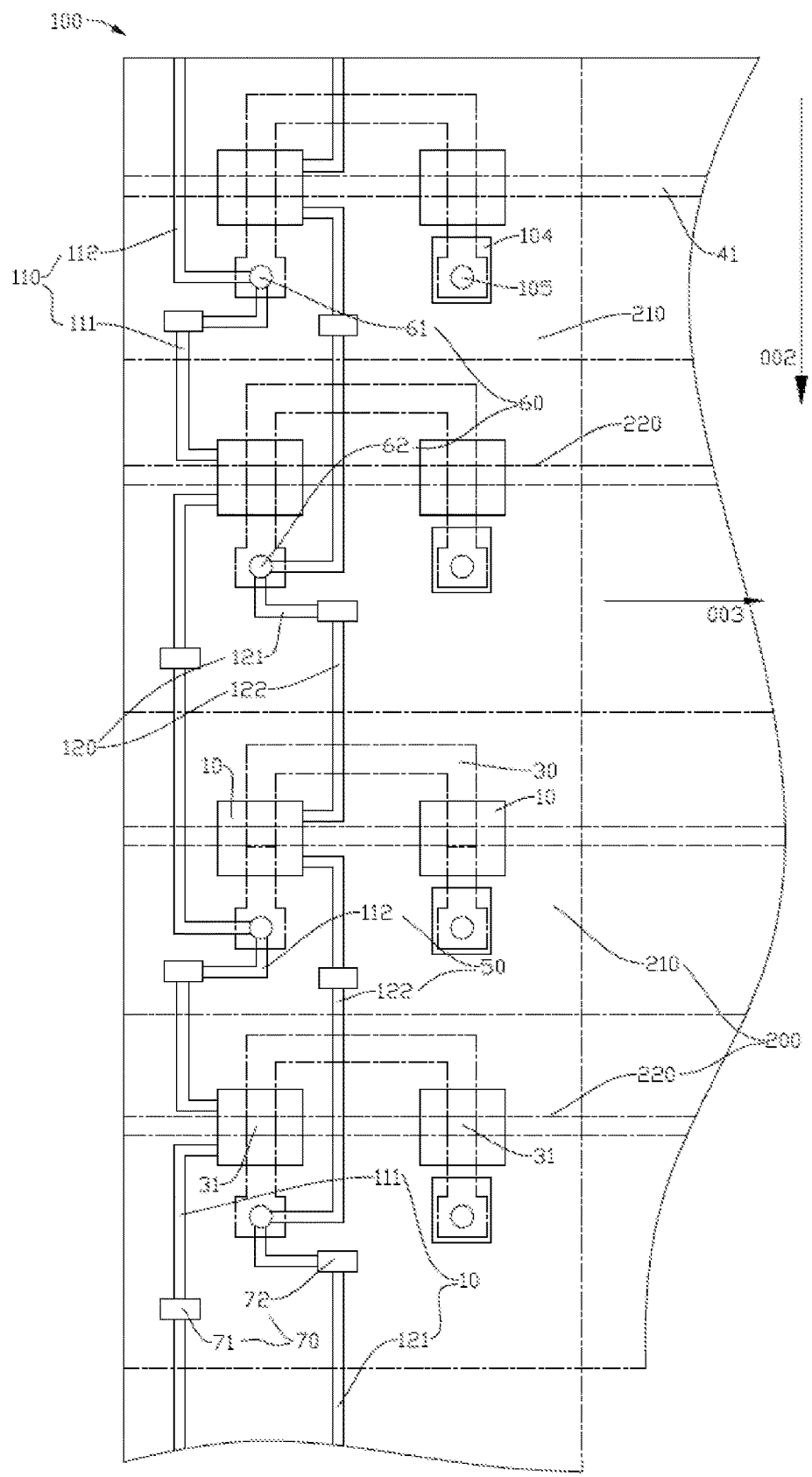
FIG. 3 is a schematic plan view of a principle of changing line of an array substrate according to an embodiment of the present invention.

In some embodiments, referring to FIG. 3, the array substrate 100 of the present invention further comprises a first pixel set 210 and a second pixel set 220 that are arranged alternately along a second direction 002. The first pixel set 210 is a set of a plurality of pixel units 200 arranged along the second direction 002, and the second pixel set 220 is also a set of a plurality of pixel units 200 arranged along the second direction 002. The number of the pixel units 200 in the first pixel set 210 and in the second pixel set 220 may be the same or different. However, the first pixel set 210 and the second pixel set 220 need to be arranged alternately along the second direction 002. The array substrate 100 of the present invention is further provided with a first conductive path 110 and a second conductive path 120, and the first conductive path 110 is used for sequentially connecting the first pixel set 210, and the second conductive path 120 is used for sequentially connecting the second pixel set 220. In the first pixel set 210, the first metal layer 10 serves as a path layer 111 of the first conductive path 110 and a signal layer 122 of the second conductive path 120 respectively, the second metal layer 50 serves as a signal layer 112 of the first conductive path 110 and a path layer 121 of the second conductive path 120 respectively. In the second pixel set 220, the first metal layer 10 serves as a signal layer 112 of the first conductive path 110 and a path layer 121 of the second conductive path 120 respectively, the second metal layer 50 serves as a path layer 111 of the first conductive path 110 and a signal layer 122 of the second conductive path 120 respectively. The path layer 111 of the first conductive path 110 and the signal layer 112 of the first conductive path 110 are connected through a first via hole 71, the path layer 121 of the second conductive path 120 and the signal layer 122 of the second conductive path 120 are connected through a second via hole 71. The signal layer 111 of the first conductive path 110 is electrically connected to the semiconductor layer 30 through the first signal hole 61, and the signal layer 121 of the second conductive path 120 is electrically connected to the semiconductor layer 30 through the second signal hole 62. Since only the first signal hole 61 exists in the first pixel set 210, that is, only the signal layer 112 of the first conductive path 110 is electrically connected to the semiconductor layer 30. The signal layer 122 of the second conductive path 120 passes through the semiconductor layer 30 by using the first metal layer 10, without connecting to the semiconductor layer 30. Therefore, in the first pixel set 210, only the first conductive path 110 is electrically connected to the first pixel set 30, that is, the pixel unit 200 in the first pixel set 210 only receives the signal data of the first conductive path 110. In the second pixel set 220, only the second signal hole 62 exists, correspondingly, the pixel unit 200 in the second pixel set 220 only receives the signal data of the second conductive path 120. In the process of arranging the first pixel set 210 and the second pixel set 220 alternately along the second direction 002, the first path 110 connects the first pixel set 210 sequentially, and the second path 120 connects the second pixel set sequentially, that is, the first pixel set 210 is connected in series through the first conductive path 110, and the second pixel set 220 is connected in series through the second conductive path 120, and the two sets of pixels that are arranged alternately cross each other without connecting, forming two independent paths.

In some embodiments, the independence of the first conductive path 110 and the second conductive path 120 makes the density of the pixel unit 200 increase in unit area in the array substrate 100, and makes a part of the pixels on the array substrate 100 be driven by two independent drive circuits 310, and the two independent drive circuits 310 connect the first conductive path 110 and the second conductive path 120 respectively. When signals of the two independent drive circuits 310 coordinate with each other, the display function of the array substrate 100 can be realized together, and the resolution of the display panel is improved. Compared with the existing product in which a single metal layer is provided to realize the design of the first conductive path 110 and the second conductive path 120, the array substrate 100 of the present invention utilizes the changing line design of the first metal layer 10 and the second metal layer 50 to reasonably utilize the first metal layer 10 and eliminate the production or occupation of a metal layer, thereby eliminating a mask manufacturing process, saving manufacturing costs, simplifying the product structure, reducing product thickness, and improving product quality.

In some embodiments, understandably, in order to balance the power of the two independent drive circuits 310, the total number of the pixel units 200 in the first pixel set 210 and in the second pixel set 220 should be equal, and the number of the pixel units 200 in each of the first pixel sets 210 and the number of the pixel units 200 in each of the second pixel sets 220 are preferably same. This facilitates the signal distribution of the two independent drive circuits 310 while keeping the total electric resistance of the respective first conductive path 110 and the second conductive path 120 unchanged, and makes the signal interference between the first conductive path 110 and the second conductive path 120 more balanced, and guarantees the consistency of the real picture.

In some embodiments, in the third direction 003 perpendicular to the second direction 002, a plurality of the first pixel sets 210 are sequentially arranged, and a plurality of the second pixel sets 220 are also sequentially arranged, so that the first pixel sets 210 and the second pixel sets 220 are arranged in a row on the array substrate 100 of the present invention, and each row of the first pixel sets 210 and each row of the second pixels sets 220 are arranged alternately. The scanning metal layer 41 extends along the third direction 003 and passes through each row of the first pixel sets 210 or each row of the second pixel sets 220 to achieve the signal conduction control to a single row of the first pixel sets 210 or a single row of the second pixel sets 220.

Figure 2:
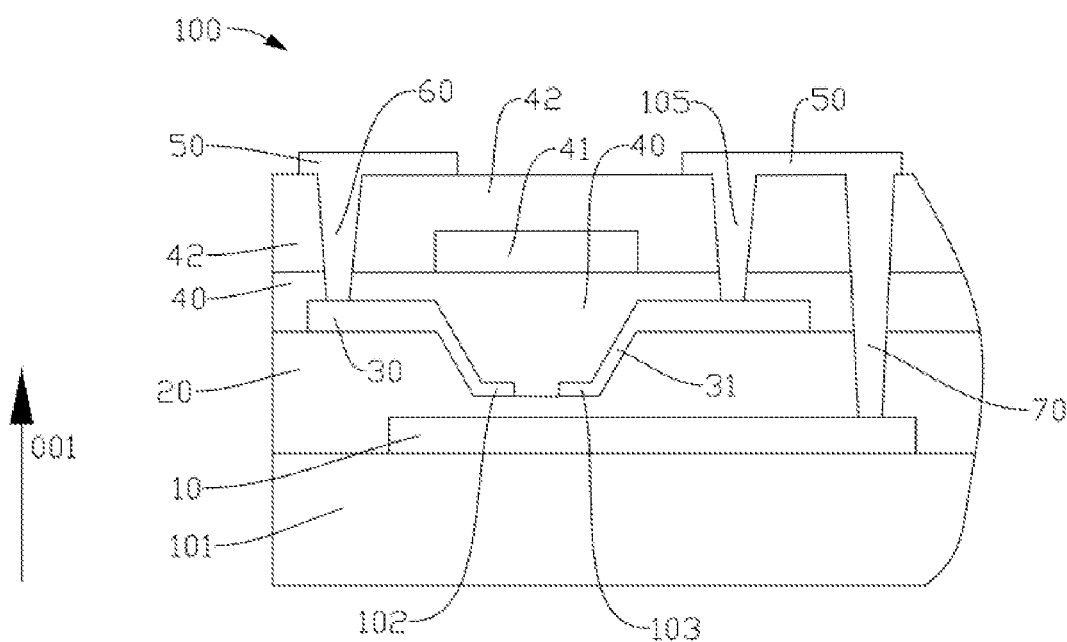
FIG. 2 is a schematic diagram of a layer structure and a hole of an array substrate according to some embodiments of the present invention.

Further, referring to FIG. 2 and FIG. 3, the second metal layer 50 is also used to form a pixel electrode 104 of the array substrate 100, and the pixel electrode 104 is connected with the semiconductor layer 30 through a conductive hole 105 to form a conductive path of a single pixel unit 200.

In some embodiments, inside the first pixel set 210 and the second pixel set 220, the first conductive path 110 and the second conductive path 120 are separated from each other by the buffer layer 20. In order to keep the first conductive path 110 and the second conductive path 120 also separated from each other, it is necessary that the first via hole 71 and the second via hole 72 are also separated from each other by the buffer layer 20. Thus, in an embodiment, during the respective preparation processes of the first metal layer 10 and the second metal layer 50, it is necessary to design a patterned lines that coordinate with each other, so that the via hole 71 of the first conductive path 110 and the via hole 72 of the second conductive path 120 are separated from each other.

In some embodiments, in the array substrate 100 described in the present invention, the array substrate 30 further comprises a source electrode 102 and a drain electrode 103, and the semiconductor layer 30 is provided with a channel 31 for connecting the source electrode 102 and the drain electrode 103 of the array substrate 100. After the signal data of the first conductive path 110 and the second conductive path 120 is transmitted to the semiconductor layer 30 through the signal hole 60, the conduction of the channel 31 is realized through the scanning metal layer 41. Specifically, the conduction of the channel 31 is realized by a gate electrode that matches the shape of the channel 31, and the gate electrode is formed by the scanning metal layer 41. Thus, the signal data is transmitted between the source 102 and the drain 103, and the pixel unit 200 performs a display function according to the data signal. Due to the narrow band gap of the semiconductor layer 30, electron transitions easily occur under the lighting conditions, resulting in unintended conduction of the channel 31. Therefore, the first metal layer 10 needs to cover the channel 31 in the first direction 001. The first metal layer 10 plays another important role in the array substrate 100 of the present invention, namely, achieving the light shielding of the channel, so as to prevent the light source below the array substrate 100 from interfering with the channel 31.

In some embodiments, understandably, the shape of the first metal layer 10 is set according to the channel 31, that is, the first metal layer can effectively perform the light shielding function as long as it fully covers the channel 31. In order to avoid the shielding of the light sources below the array substrate 100 by the metal layers, the first metal layer 10, the scanning metal layer 41, and the second metal layer 50 are at least partially overlapped in the first direction 001, so as to avoid light shielding by the metal and avoid affecting the light transmittance of the display panel. In these embodiments, the larger the overlapping portion of the first metal layer 10, the scanning metal layer 41, and the second metal layer 50 in the first direction 001, the greater the light transmittance of the array substrate 100 is.

On the other hand, in some embodiments, the width of the scanning metal layer 41 is the same as the width of the channel 31, and the conduction function of the channel 31 by the scanning metal layer 41 can be better achieved.

Figure 4:
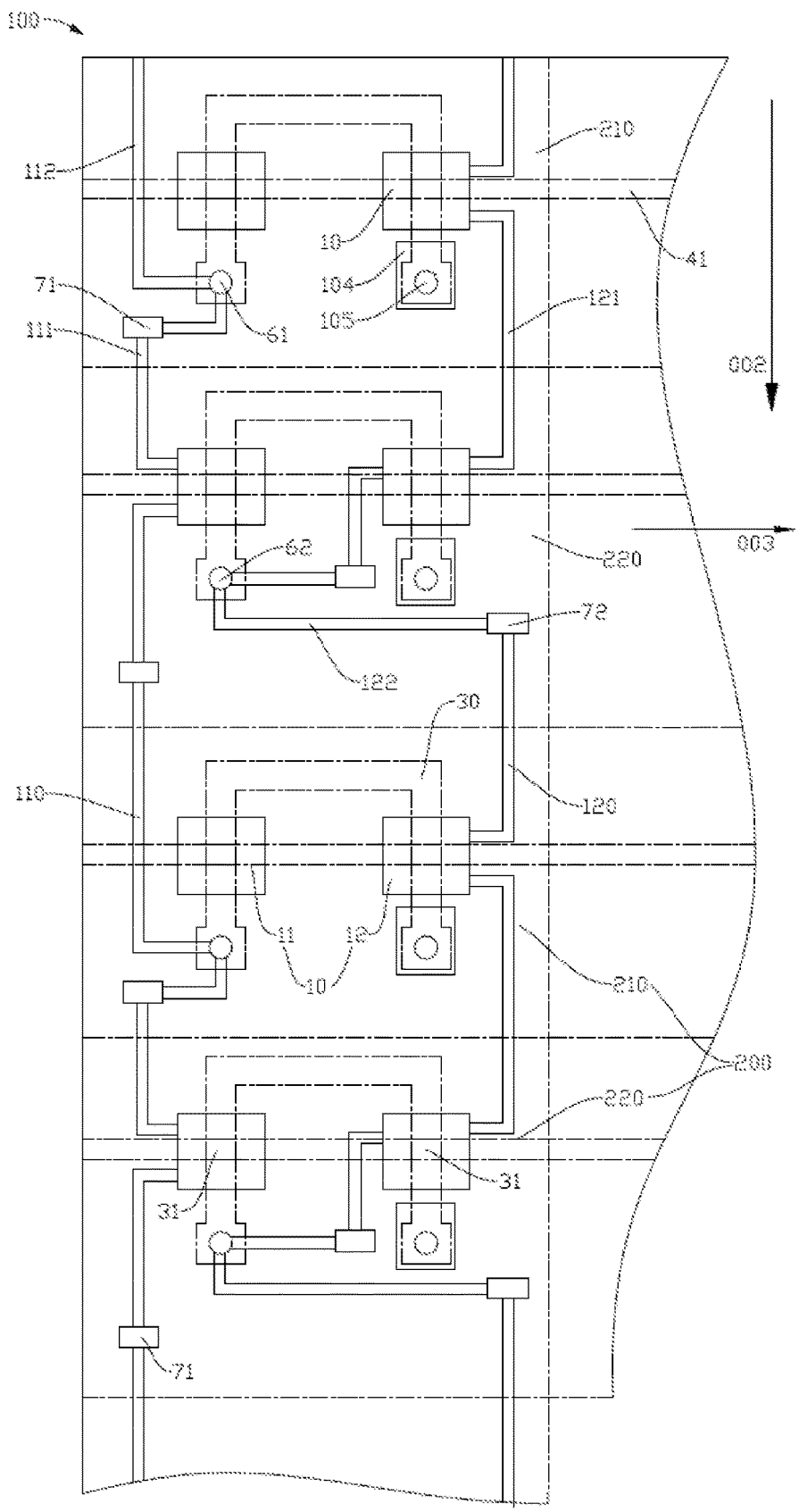
FIG. 4 is a schematic plan view of a principle of changing line of an array substrate according to another embodiment of the present invention.

In the embodiment of FIG. 4, in the single pixel unit 200, the number of the channels 31 of the semiconductor layer 30 is two. The two channels 31 are arranged in the third direction 003 perpendicular to the second direction 002. A connecting line between the two channels 31 is positioned at one end of the channel 31 away from the signal hole 60. Correspondingly, in the single pixel unit 200, the first metal layer 10 is divided into a first metal block 11 and a second metal block 12 that are independent of each other. The first metal block 11 and the second metal block 12 are used to shield the two channels 31 from light respectively, and provide a light shielding function. The first metal block 11 and the second metal block 12 are also separated by the buffer layer 20 and are independent of each other. Thus, the first conductive path 110 and the second conductive path 120 may be disposed to connect the first metal block 11 and the second metal block 12 respectively, to achieve separate conductive paths. Since the interval between the first metal block 11 and the second metal block 12 can effectively avoid the interference between signals, this embodiment makes better use of the shape of the first metal layer 10 than the provision of a special patterned shape to realize the conductive path.

In the embodiments of FIG. 3 and FIG. 4, the number of the pixel units 200 in the first pixel set 210 is one, and the number of the pixel units 200 in the second pixel set 220 is also one, that is, the array substrate 100 arranges the first pixel set 210 and the second pixel set 220 in the second direction 002 by changing lines in an interlaced way. The first conductive path 110 and the second conductive path 120 both comprise the via hole 71 of the first conductive path 110 and the via hole 72 of the second conductive path 120 in each pixel unit 200. The array substrate 100 that changes line in progressive way takes the minimum display unit in the array substrate 100 for changing line design. In the case where a certain pixel set fails and is not displayed, the defects of the single pixel unit 200 can be compensated for by the display of the pixel units 200 around it, which is not easily found by the user, and the influence on the display effect is also reduced to the minimum.

Figure 5:
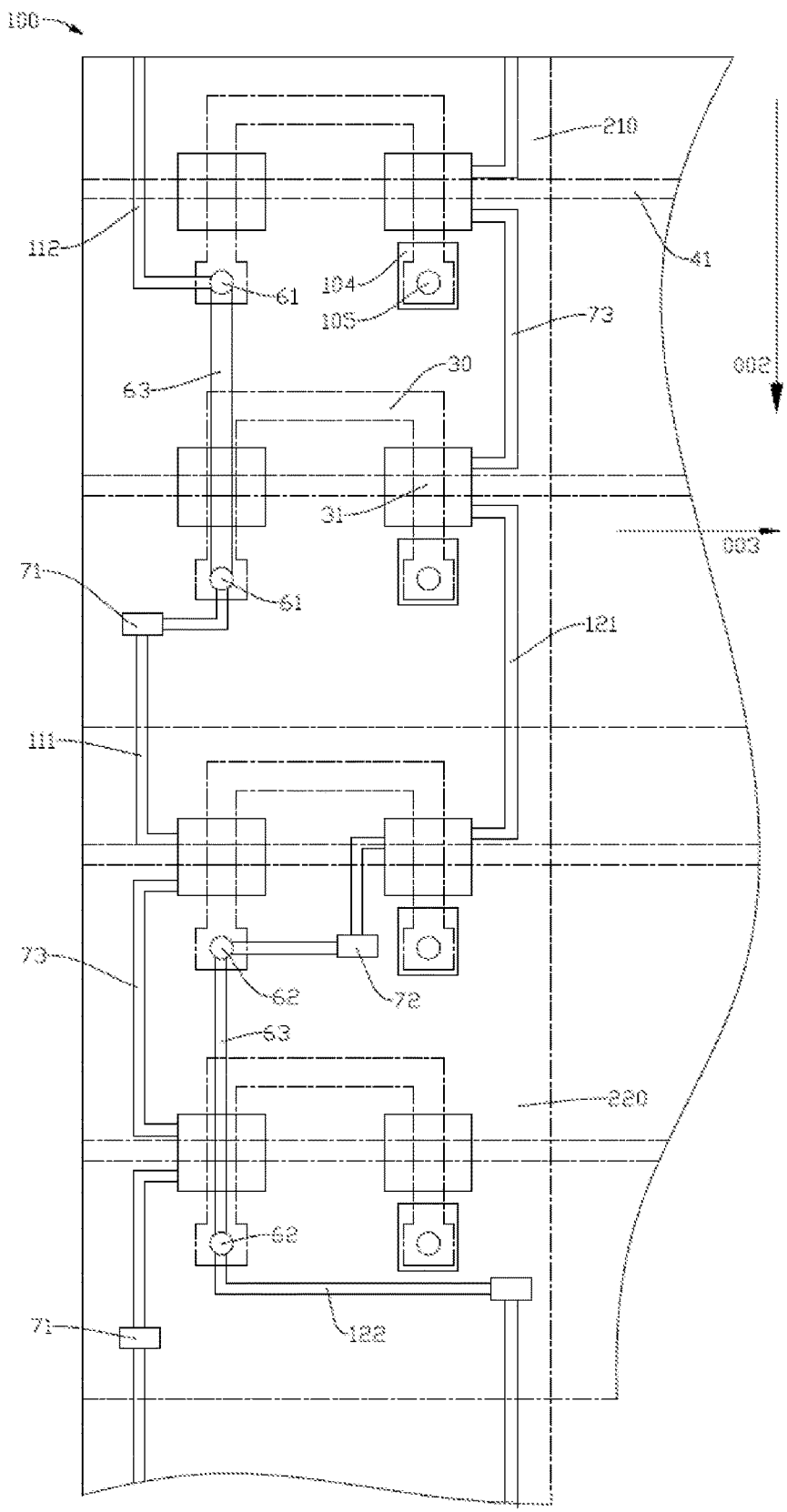
FIG. 5 is a schematic plan view of a principle of changing line of an array substrate according to yet another embodiment of the present invention.

In another embodiment, the first pixel set 210 is two of the pixel units 200. Correspondingly, the second pixel set 220 is also two of the pixel units 200 (see FIG. 5). When the span between the first pixel set 210 and the second pixel set 220 is large, the number of changing line can be reduced, that is, the number of the via holes 70 can be reduced. This simplifies product structure and processing complexity and increases production efficiency. Understandably, in order to realize the signal conduction of each of the pixel units 200 in the first pixel set 210 and the second pixel set 220, the second metal layer 50 also needs to be provided with a signal line 63 that connects the pixel unit 200 in the first pixel set 210 or in the second pixel set 220. Similarly, the first metal layer 10 also needs to be provided with a path line 73 that sequentially connects the first metal layer 10 in each of the pixel units 200.

In some embodiments, understandably, the number of the pixel units 200 in the first pixel set 210 and in the second pixel set 220 may also be set to more than two, so that the span between the first conductive path 110 and the second conductive path 120 after each line changing is further increased. This can further reduce the number of via holes 70 and simplify the structure. This invention is not overly limited here.

Figure 6:
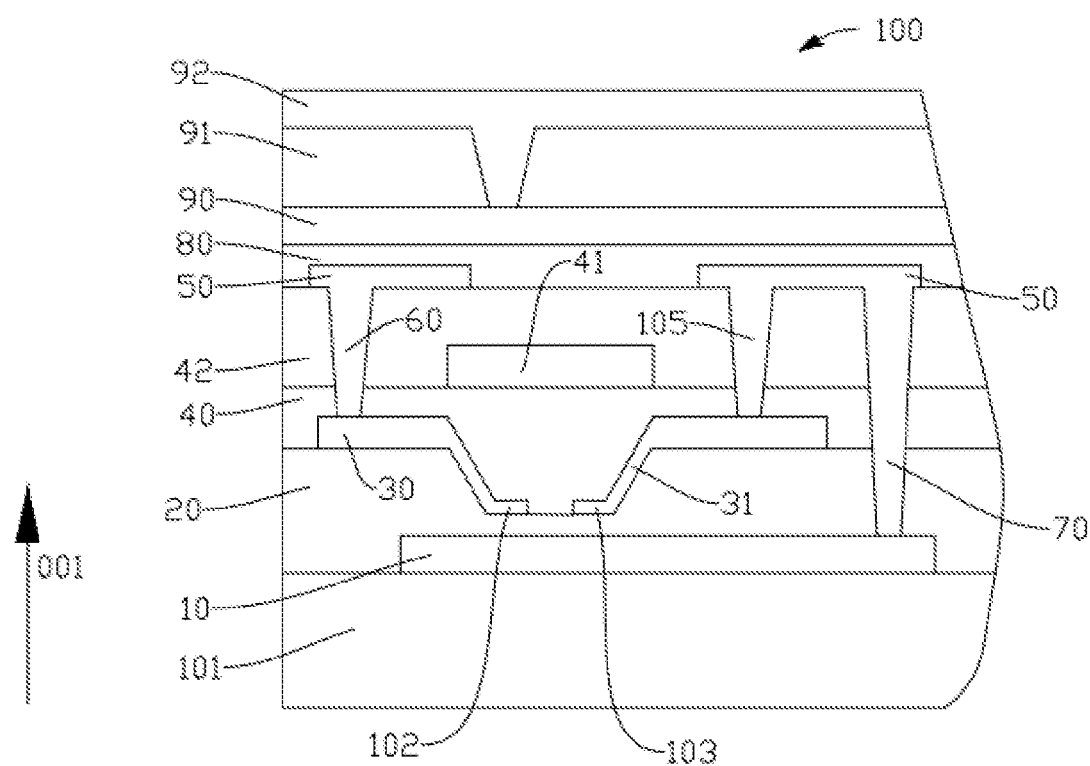
FIG. 6 is a schematic diagram of another layer structure and a hole of an array substrate according to some embodiments of the present invention.

In one embodiment, referring to FIG. 6, on the basis of the above-mentioned array substrate 100, a planarization layer 80 and a third metal layer 90 sequentially stacked along the first direction 001 are further provided, and the planarization layer 80 is positioned between the second metal layer 50 and the third metal layer 90. The third metal layer 90 can be set as a touch electrode of the array substrate 100 because it does not need to be used for changing line. The insulating layer 91 made of silicon nitride layer is covered on the third metal layer 90. By making a hole in the insulating layer 91, the third metal layer 90 is connected to an indium tin oxide layer 92 of the upper layer. The indium tin oxide layer 92 can sense a capacitance change caused by a finger touching the liquid crystal panel, thereby realizing a touch control function. The third metal layer 90 of the array substrate 100 of the present invention is not used to change line, so that the third metal layer 90 can be set as a touch sensing line. Further, the disposition of the third metal layer 90 on the array substrate 100 allows the thickness of the array substrate 100 to be reduced, thereby realizing the function of In Cell Touch.

Figure 7:
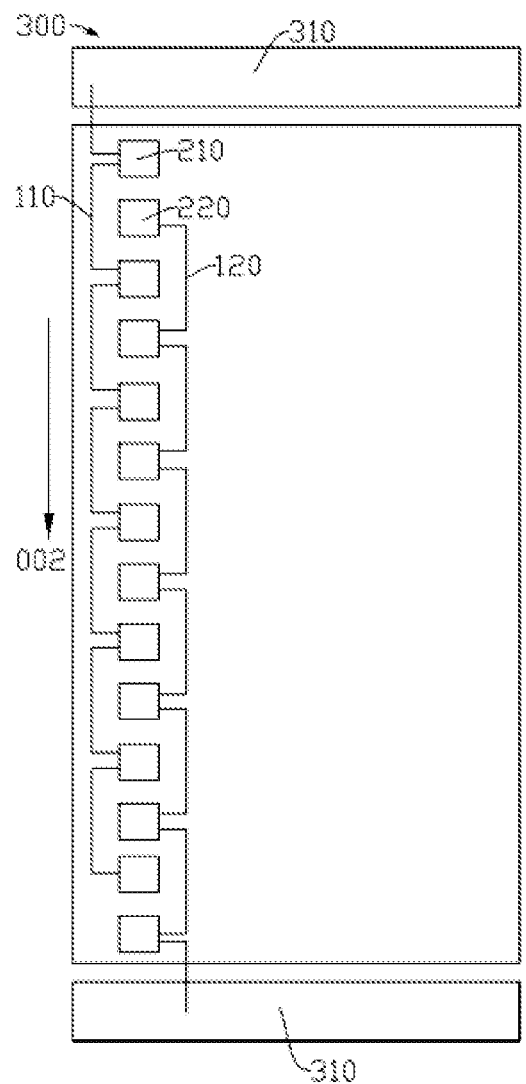
FIG. 7 is a schematic diagram of a display panel according to some embodiments of the present invention.

In some embodiments, the present invention further relates to a display panel 300 (see FIG. 7). The display panel 300 may be a liquid crystal panel, or may be an OLED panel. The type of the display panel 300 is not limited thereto. The display panel 300 comprises the above array substrate 100, and drive circuits 310 which are respectively arranged at two ends of the array substrate 100 along the second direction 002. One of the drive circuits 310 is electrically connected to the first conductive path 110 and the other of the drive circuits 310 is electrically connected to the second conductive path 120. Therefore, by using the structure arrangement of the two independent signal paths on the array substrate 100 of the present invention, the display panel 300 is realized to drive two sets of the pixel units 200 on the array substrate 100 through two independent drive circuits 310 respectively and reduce the load of the single drive circuit 310 and effectively avoid defects of signal delay.

In some embodiments, understandably, since the mobile terminal according to the present invention comprises the display panel 300, it has a higher screen resolution and a thinner body, and an improved overall quality.

Above are embodiments of the present invention, which does not limit the scope of the present invention. Any modifications, equivalent replacements or improvements within the spirit and principles of the embodiment described above should be covered by the protected scope of the invention.

What is claimed is:

1. An array substrate, comprising:
    a first metal layer, a buffer layer, a semiconductor layer, an insulating layer, a scanning metal layer, an inter layer dielectric, and a second metal layer that are sequentially stacked on a glass substrate along a first direction, and a signal hole connecting the semiconductor layer and the second metal layer, and a via hole connecting the first metal layer and the second metal layer;
    the array substrate further comprising a first pixel set and a second pixel set that are arranged alternately along a second direction; and a first conductive path sequentially connecting the first pixel set and a second conductive path sequentially connecting the second pixel set;
    in the first pixel set, the first metal layer serving as a path layer of the first conductive path and a signal layer of the second conductive path respectively, the second metal layer serving as a signal layer of the first conductive path and a path layer of the second conductive path respectively;
    in the second pixel set, the first metal layer serving as a signal layer of the first conductive path and a path layer of the second conductive path respectively, the second metal layer serving as a path layer of the first conductive path and a signal layer of the second conductive path respectively.

2. The array substrate according to claim 1, wherein the number of pixel units in the first pixel set is the same as the number of pixel units in the second pixel set.

3. The array substrate according to claim 2, wherein the first metal layer and the second metal layer are provided with patterned lines that coordinate with each other, so that the via hole of the first conductive path and the via hole of the second conductive path are separated from each other.

4. The array substrate according to claim 3, wherein the array substrate further comprises a source electrode and a drain electrode, and the semiconductor layer is provided with a channel for connecting the source electrode and the drain electrode of the array substrate, and the first metal layer covers the channel in the first direction to achieve light shielding of the channel.

5. The array substrate according to claim 4, wherein the number of the channels of the semiconductor layer in a single pixel unit is two, and the two channels are arranged along a third direction perpendicular to the second direction; and the first metal layer is divided into a first metal block and a second metal block that are independent of each other, and the first metal block and the second metal block are used to shield the two channels from light respectively; and the first conductive path connecting the first metal block, and the second conductive path connecting the second metal block.

6. The array substrate according to claim 1, wherein the first pixel set comprises only one pixel unit, and the second pixel set also comprises only one pixel unit, and each of the pixel units comprises the via hole of the first conductive path and the via hole of the second conductive path.

7. The array substrate according to claim 1, wherein the first pixel set comprises at least two pixel units, and the second pixel set also comprises at least two pixel units, and the second metal layer in the first pixel set and in the second pixel set further comprises a signal line that sequentially connects the pixel units in the first pixel set or the second pixel set, and a path line that sequentially connects the first metal layer.

8. The array substrate according to claim 1, wherein the array substrate further comprises a planarization layer and a third metal layer that are sequentially stacked along the first direction, and the planarization layer is positioned between the second metal layer and the third metal layer.

9. The array substrate according to claim 2, wherein the array substrate further comprises a planarization layer and a third metal layer that are sequentially stacked along the first direction, and the planarization layer is positioned between the second metal layer and the third metal layer.

10. The array substrate according to claim 3, wherein the array substrate further comprises a planarization layer and a third metal layer that are sequentially stacked along the first direction, and the planarization layer is positioned between the second metal layer and the third metal layer.

11. The array substrate according to claim 4, wherein the array substrate further comprises a planarization layer and a third metal layer that are sequentially stacked along the first direction, and the planarization layer is positioned between the second metal layer and the third metal layer.

12. The array substrate according to claim 5, wherein the array substrate further comprises a planarization layer and a third metal layer that are sequentially stacked along the first direction, and the planarization layer is positioned between the second metal layer and the third metal layer.

13. The array substrate according to claim 6, wherein the array substrate further comprises a planarization layer and a third metal layer that are sequentially stacked along the first direction, and the planarization layer is positioned between the second metal layer and the third metal layer.

14. The array substrate according to claim 7, wherein the array substrate further comprises a planarization layer and a third metal layer that are sequentially stacked along the first direction, and the planarization layer is positioned between the second metal layer and the third metal layer.

15. A display panel, comprising the array substrate according to claim 1, and a first drive circuit and a second drive circuit which are respectively arranged at two ends of the array substrate along the second direction, and the first drive circuit being electrically connected to the first conductive path and the second drive circuit being electrically connected to the second conductive path.

16. A mobile terminal, comprising the display panel according to claim 15.

* * * * *